United States Patent [19]
Soneda et al.

[11] Patent Number: 5,545,941
[45] Date of Patent: Aug. 13, 1996

[54] CRYSTAL OSCILLATOR CIRCUIT

[75] Inventors: Mitsuo Soneda; Takahiro Seki, both of Kanagawa, Japan

[73] Assignee: Sony Corporation, Japan

[21] Appl. No.: 489,714

[22] Filed: Jun. 13, 1995

[30] Foreign Application Priority Data

Jun. 30, 1994 [JP] Japan .................................. 6-150055

[51] Int. Cl.$^6$ ...................................................... H03B 5/36
[52] U.S. Cl. .................................... 310/318; 331/116 FE
[58] Field of Search .................................. 310/318, 319; 331/116 FE

[56] References Cited

U.S. PATENT DOCUMENTS

| | | | |
|---|---|---|---|
| 4,346,350 | 8/1982 | Morokawa et al. | 331/116 FE |
| 4,360,789 | 11/1982 | Lewin et al. | 331/116 FE |
| 4,387,349 | 6/1983 | Rapp | 331/116 FE |
| 4,459,565 | 7/1984 | Leach | 331/116 FE |
| 4,710,730 | 12/1987 | Doyle | 331/116 FE |
| 4,845,444 | 8/1989 | Doyle | 331/116 FE |
| 4,956,618 | 9/1990 | Ulmer | 331/116 FE |
| 4,965,535 | 10/1990 | Neuman | 331/116 FE |
| 5,142,251 | 8/1992 | Boomer | 331/116 FE |
| 5,208,558 | 5/1993 | Shigehara et al. | 331/116 FE |
| 5,325,074 | 6/1994 | Suenaga | 331/116 FE |

FOREIGN PATENT DOCUMENTS

| | | | |
|---|---|---|---|
| 0021754 | 2/1977 | Japan | 331/116 FE |
| 0003764 | 1/1978 | Japan | 331/116 FE |
| 0151357 | 11/1979 | Japan | 331/116 FE |
| 0097704 | 7/1980 | Japan | 331/116 FE |
| 0104106 | 8/1980 | Japan | 331/116 FE |
| 2040633 | 8/1980 | United Kingdom | 331/116 FE |

Primary Examiner—Thomas M. Dougherty
Attorney, Agent, or Firm—Ronald P. Kananen

[57] ABSTRACT

A crystal oscillator circuit including a quartz vibrator; an inverter circuit connected in parallel to the quartz vibrator and comprised of at least two transistors connected at their output ends to a first power-supply potential or a second power-supply potential lower than the first power-supply potential; a first current mirror circuit, with one current input-output end connected to a connection line with the inverter circuit of the first power-supply potential, the other current input-output end connected to the output end of the oscillator circuit; and either a second current mirror circuit having two current input-output ends, one current input-output end connected to a connection line with the inverter circuit of the second power-supply potential, the other current input-output end connected to the output end of the oscillator circuit, current flowing to one current input-output end, current flowing to the other current input-output end, and the level of the output end of the oscillator circuit being shifted to the level of the second power-supply potential when the output end of the inverter circuit is connected to the second power-supply potential or a circuit for shifting the level of the output end of the inverter circuit to the level of a second power-supply potential in accordance with the level of the input end of the inverter circuit when the output end of the circuit is connected to a second power-supply potential.

13 Claims, 8 Drawing Sheets

SIGNAL WAVEFORM AT NODE n1

SIGNAL WAVEFORM AT NODE n2

SIGNAL WAVEFORM AT NODE n5

CRYSTAL OSCILLATOR CIRCUIT

BACKGROUND OF THE INVENTION

1. Field of the Invention

The present invention relates to a crystal oscillator circuit using a quartz vibrator and an inverter.

2. Description of the Related Art

FIG. 1 is a view showing the basic configuration of a crystal oscillator circuit using a quartz vibrator and a CMOS inverter.

This circuit is provided at the outside of the chip with a quartz vibrator X1, two capacitors C1 and C2 connected between its two ends and the ground, and a stabilizing resistor element R2 for stabilizing the oscillation operation, one end of which is connected to one end of the quartz vibrator X1 and one electrode of the capacitor C2.

In the chip, the circuit is provided with a CMOS inverter 1 for voltage amplification parallel to the quartz vibrator X1. The input side node n1 of the CMOS inverter 1 is connected through an input-output terminal T1 to the other end of the quartz vibrator X1 and one electrode of the capacitor C1 outside the chip, while the output side node n2 of the CMOS inverter 1 is connected through the input-output terminal T2 to the other end of the stabilizing resistor element R2 outside the chip. Further, the output side node n2 and input side node n1 of the voltage amplification CMOS inverter 1 have connected between them a feedback resistor element R1 parallel to the CMOS inverter 1. The input of the output inverter 2 is connected to the output side node n2.

The resistance of the feedback resistor element R1 is selected to be a value greater than the resistance of the stabilizing resistor element R2.

In this crystal oscillator circuit, a sine wave signal is generated by the resonance of the quartz vibrator X1 and the two capacitors C1 and C2. This sine wave signal is amplified by the CMOS inverter 1 and then shaped in its waveform by the inverter 2 to give the output OUT.

Crystal oscillator circuits using quartz vibrators and CMOS inverters in this way are widely used as oscillators with a high degree of stability of frequency with respect to changes in the ambient temperature and power-supply voltage.

In the above-mentioned oscillator circuit, however, since the output side node n2 of the CMOS inverter 1 is connected to the outside input-output terminal T2, noise enters from the outside and therefore it suffers from the disadvantage of generation of unnecessary pulses at the output node.

Further, since the oscillation waveform of the oscillator circuit, that is, the waveform at the nodes n1 and n2, became a sine wave, a large short current flowed near the logical threshold value in the voltage amplification CMOS inverter 1 to which the sine wave was input, which became a major disadvantage when operating at a low power consumption.

In the same way, since the amplitude of the sine wave of the node n1 does not swing fully between the power-supply voltage and the ground for example due to the loss resistance of the stabilizing resistor element R2 and the quartz vibrator X1, the short current continues to flow at all times during operation to the voltage amplification CMOS inverter 1, which became a major disadvantage when operating at a low power consumption.

SUMMARY OF THE INVENTION

The object of the present invention is to provide a crystal oscillator circuit which is able to prevent the entry of noise from the outside, reduce the short current, and achieve low power consumption.

To achieve the above object, the present invention provides as one aspect a crystal oscillator circuit which is comprised of a quartz vibrator; an inverter circuit to whose input end and output end the quartz vibrator is connected in parallel and comprised of at least two transistors connected at their output ends to a first power-supply potential or a second power-supply potential lower than the first power-supply potential in accordance with the level appearing at the input end; a first current mirror circuit having two current input-output ends, one current input-output end connected to a connection line with the inverter circuit of the first power-supply potential, the other current input-output end connected to the output end of the oscillator circuit, current flowing to one current input-output end, current flowing to the other current input-output end, and the level of the output end of the oscillator circuit being shifted to the level of the first power-supply potential when the output end of the inverter circuit is connected to the first power-supply potential; and a second current mirror circuit having two current input-output ends, one current input-output end connected to a connection line with the inverter circuit of the second power-supply potential, the other current input-output end connected to the output end of the oscillator circuit, current flowing to one current input-output end, current flowing to the other current input-output end, and the level of the output end of the oscillator circuit being shifted to the level of the second power-supply potential when the output end of the inverter circuit is connected to the second power-supply potential.

In the first aspect of the invention, the crystal oscillator circuit of the present invention performs an oscillation operation by a quartz vibrator and an inverter circuit. At that time, if for example the input level of the inverter circuit is the low level, the output end of the inverter circuit is connected to the first power-supply potential and the level of the output end shifts to the level near the level of the first power-supply potential. At this time, current flows to the first current mirror circuit, but current does not flow to the second current mirror circuit. As a result, the level of the output end of the crystal oscillator circuit shifts to the level of the first power-supply potential. As opposed to this, if for example the input level of the inverter circuit is the high level, the output end of the inverter circuit is connected to the second power-supply potential and the level of the output end shifts to the level near the level of the second power-supply potential. At this time, current does not flow to the first current mirror circuit, but current flows to the second current mirror circuit. As a result, the level of the output end of the crystal oscillator circuit shifts to the level of the second power-supply potential. In this way, the crystal oscillator circuit does not have the output end of the inverter circuit and the output end of the crystal oscillator circuit directly connected, so even if outside noise enters the output end of the inverter circuit from the input-output terminal connected to the quartz vibrator etc. provided outside the chip, that noise does not appear in the output and therefore unnecessary pulses can be kept from being generated.

As another aspect, the present invention provides a crystal oscillator circuit which is comprised of a quartz vibrator; an inverter circuit to whose input end and output end the quartz vibrator is connected in parallel and comprised of at least two transistors connected at their output ends to a first power-supply potential or a second power-supply potential lower than the first power-supply potential in accordance with the level appearing at the input end; a current mirror circuit having two current input-output ends, one current input-output end connected to a connection line with the inverter circuit of the first power-supply potential, the other current input-output end connected to the output end of the oscillator circuit, current flowing to one current input-output end, current flowing to the other current input-output end, and the level of the output end of the oscillator circuit being shifted to the level of the first power-supply potential when the output end of the inverter circuit is connected to the first power-supply potential; and a circuit for shifting the level of the output end of the inverter circuit to the level of a second power-supply potential in accordance with the level of the input end of the inverter circuit when the output end of the circuit is connected to a second power-supply potential.

In the second aspect of the invention, the crystal oscillator circuit of the present invention again performs an oscillation operation by a quartz vibrator and an inverter circuit. At that time, if for example the input level of the inverter circuit is the low level, the output end of the inverter circuit is connected to the first power-supply potential and the level of the output end shifts to the level near the level of the first power-supply potential. At this time, a current flows to the first current mirror circuit, and the circuit for shifting the level of the output end to the second power-supply potential remains non-actuated in state. As a result, the level of the output end of the crystal oscillator circuit shifts to the level of the first power-supply potential. As opposed to this, if for example the input level of the inverter circuit is the high level, the output end of the inverter circuit is connected to the second power-supply potential and the level of the output end shifts to the level near the level of the second power-supply potential. At this time, a current does not flow to the first current mirror circuit and the circuit for shifting the level of the output end to the second power-supply potential is actuated. As a result, the level of the output end of the crystal oscillator circuit shifts to the level of the second power-supply potential.

The crystal oscillator circuit of the present invention may also perform the oscillation operation by a voltage lowered by the voltage dropping circuit. As a result, the short current of the inverter circuit caused by the sine wave signal which is generated can be reduced.

Preferably, the crystal oscillator circuit is further provided, at least between one of the first power-supply potential and the inverter circuit and the second power-supply potential and inverter circuit, with a voltage dropping circuit for causing the power-supply potential to drop by a exactly a predetermined potential.

Preferably, the voltage dropping circuit is comprised of a diode-connected MOS transistor or a resistor element.

BRIEF DESCRIPTION OF THE DRAWINGS

These and other objects and features of the present invention will be clear from the following description of the preferred embodiments made with reference to the attached drawings, in which.

DESCRIPTION OF THE PREFERRED EMBODIMENTS

Preferred embodiments of the present invention will now be explained in detail with reference to the drawings.

Figure 1:
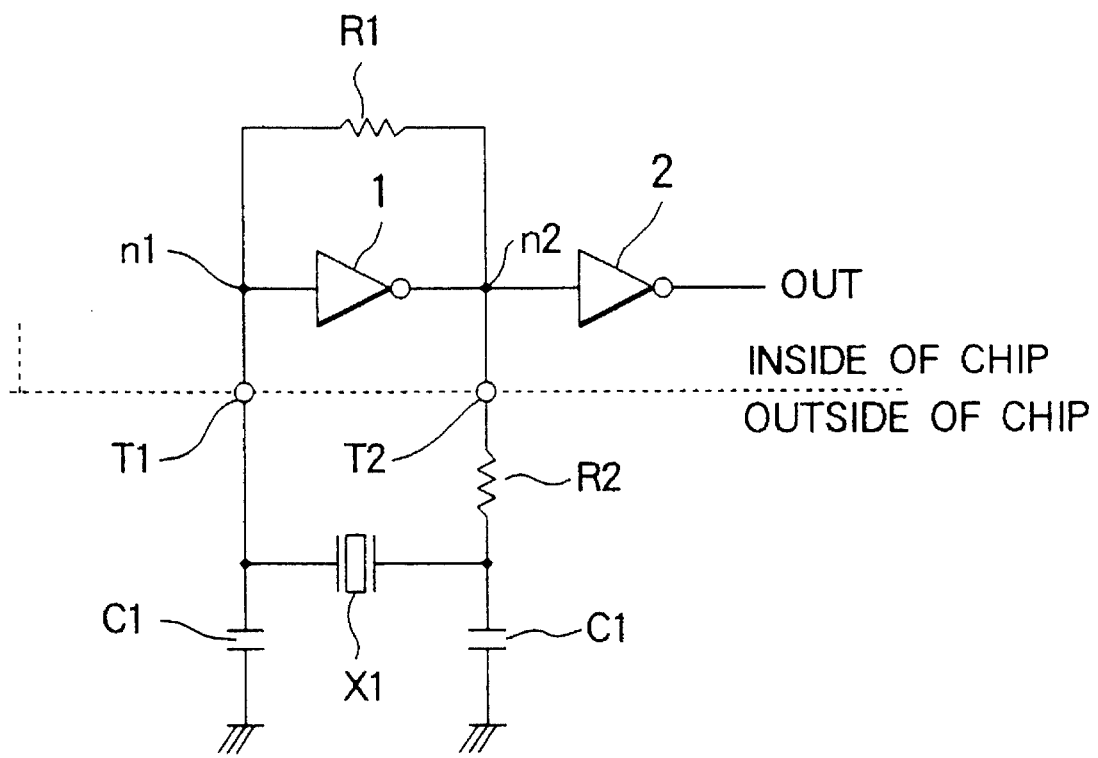
FIG. 1 is a circuit diagram of a crystal oscillator circuit using an inverter in accordance with the related art.
Figure 2:
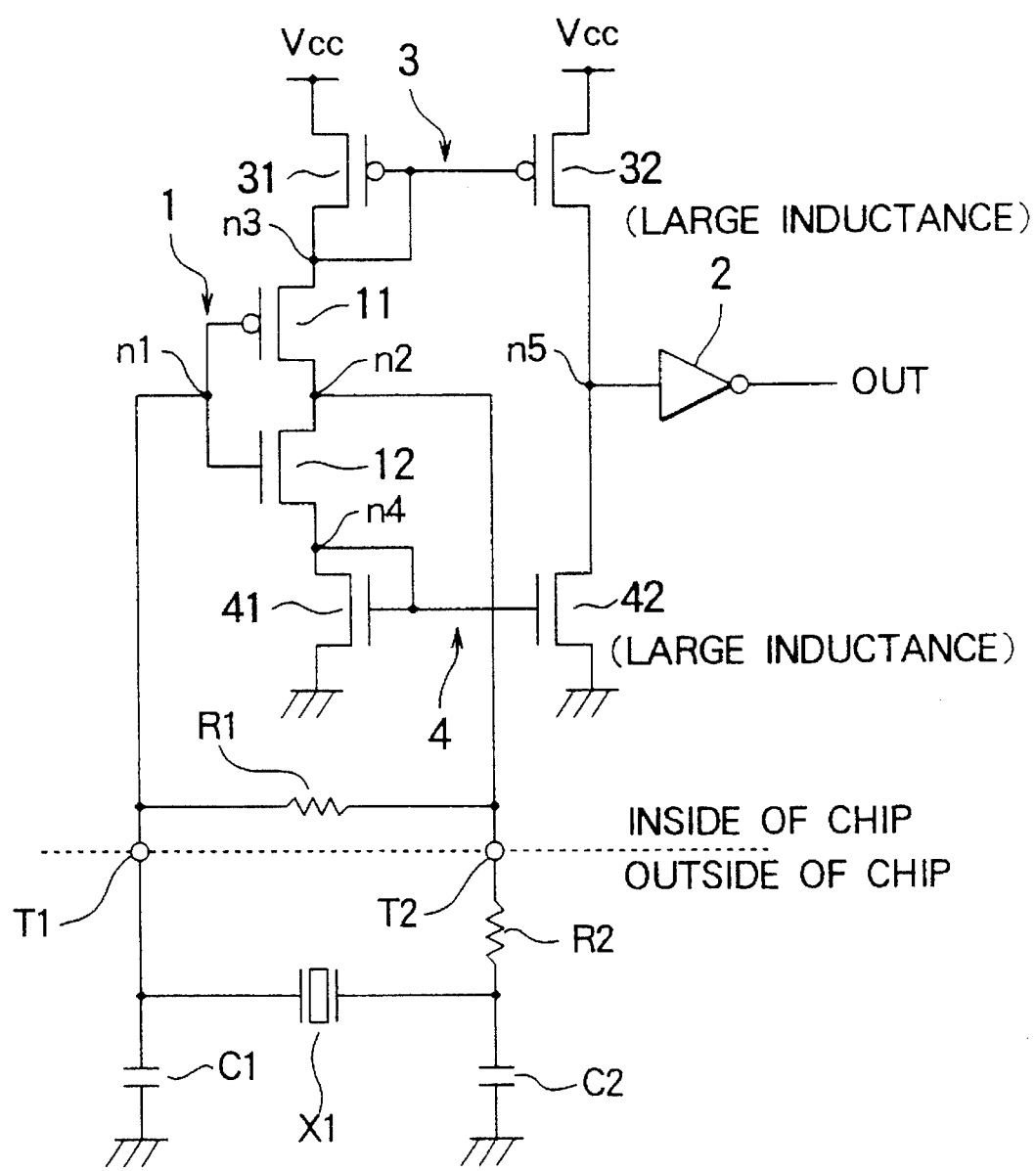
FIG. 2 is a circuit diagram of a crystal oscillator circuit using a CMOS inverter according to a first embodiment of the present invention.

FIG. 2 is a circuit diagram of a crystal oscillator circuit according to a first embodiment of the present invention. In the figure, constituent portions the same as the related art shown in FIG. 1 are given the same references.

That is, Vcc indicates the power supply voltage, X1 a quartz vibrator, C1 and C2 capacitors, R1 a feedback resistor element, R2 a stabilizing resistor element, T1 and T2 input-output terminals, n1 to n5 nodes, 1 a voltage amplification CMOS inverter, 2 an output CMOS inverter, 3 a first current mirror circuit, and 4 a second current mirror circuit.

The voltage amplification CMOS inverter 1 is comprised of a PMOS transistor 11 and NMOS transistor 12 with their gates connected and their drains connected. The node n1 is constituted by the point of connection of the gates of the PMOS transistor 11 and the NMOS transistor 12, while the node n2 is constituted by the point of connection of the drains.

Further, the source (node n3) of the PMOS transistor 11 is connected to one current input-output terminal of the first current mirror circuit 3, while the source (node n4) of the NMOS transistor 12 is connected to one current input-output terminal of the second current mirror circuit 4.

The node n1 is connected to one end of the feedback resistor element R1 and the input-output terminal T1, while the node n2 is connected to the other end of the feedback resistor element R1 and the input-output terminal T2. The input-output terminal T1 is connected to the other end of the quartz vibrator X1 and one electrode of the capacitor C1 provided outside of the chip, the input-output terminal T2 is connected to one end of the stabilizing resistor element R2, and the other end of the stabilizing resistor element R2 is connected to one end of the quartz vibrator X1 and one electrode of the capacitor C2. The other electrodes of the capacitors C1 and C2 are grounded.

The voltage amplification CMOS inverter 1 performs amplification and level inversion on the sine wave signal generated by resonance of the quartz vibrator X1 and two capacitors C1 and C2 connected in this way.

The output CMOS inverter 2 gives a rectangular waveform output signal OUT obtained by inverting, amplifying, and shaping the waveform of a signal corresponding to the output signal of the voltage amplification CMOS inverter 1 amplified by the first current mirror circuit 3 and the second current mirror circuit 4.

The first current mirror circuit 3 is comprised of the PMOS transistors 31 and 32. The sources of the two transistors 31 and 32 are connected to the supply line of the power-supply voltage Vcc, while the drain of the PMOS transistor 31 is connected to the gates of the PMOS transistors 31 and 32.

One of the current input-output ends of the first current mirror circuit 3 is comprised of the drain of the PMOS transistor 31. The drain serving as that current input-output end is connected to the source of the PMOS transistor 11 of the voltage amplification CMOS inverter 1, thereby constituting the node n3.

Further, the other current input-output end is constituted by the drain of the PMOS transistor 32. The drain serving as the other current input-output end is connected to the input side node n5 of the output CMOS inverter 2.

Further, there may be become an unbalance between the PMOS transistor 31 and the PMOS transistor 32 comprising the first current mirror circuit 3 due to process variations etc. and accordingly a leakage current may flow through the PMOS transistor 32. To prevent this, the channel length (L length) of the PMOS transistor 32 is set larger than the L length of the PMOS transistor 31.

In this circuit, the capacity of the node n5 is small, so the current driving ability of the PMOS transistor 32 may be small and even if the L length is made a certain degree larger, the node n5 can be made to swing fully.

The second current mirror circuit 4 is comprised of the NMOS transistors 41 and 42. The sources of the two transistors 41 and 42 are grounded. The drain of the NMOS transistor 41 is connected to the gates of the NMOS transistors 41 and 42.

One of the current input-output ends of the second current mirror circuit 4 is comprised of the drain of the NMOS transistor 41. The drain serving as that current input-output end is connected to the source of the NMOS transistor 12 of the voltage amplification CMOS inverter 1, thereby constituting the node n4.

Further, the other current input-output end is constituted by the drain of the NMOS transistor 42. The drain serving as the other current input-output end is connected to the input side node n5 of the output CMOS inverter 2.

Further, there may be become an unbalance between the NMOS transistor 41 and the NMOS transistor 42 comprising the second current mirror circuit 4 due to process variations, etc. Accordingly a leakage current may flow through the NMOS transistor 42. To prevent this, in the same way as the case of the first current mirror circuit 3 explained above, the channel length (L length) of the NMOS transistor 42 is set larger than the L length of the NMOS transistor 41.

In this case too the capacity of the node n5 is small so the current driving ability of the NMOS transistor 42 may be small and even if the L length is made a certain degree larger, the node n5 can be made to swing fully.

Such a configuration is equivalent to a configuration in which the PMOS transistor 31 and the NMOS transistor 41 in the diode-connected first and second current mirror circuits 3 and 4 are connected in series to the sources of the PMOS transistor 11 and the NMOS transistor 12 of the voltage amplification CMOS inverter 1.

Due to this, the potentials of the nodes n3 and n4 are, respectively, Vcc−Vthp (Vthp is the threshold value of the PMOS transistor) and Vthn (Vthn is the threshold value of the PMOS transistor).

Accordingly, the operating range of the voltage amplification CMOS inverter 1 in this embodiment becomes $\Delta V=Vcc-Vthp-Vthn$. When, for example, the threshold values, including the increase due to the substrate bias effect, of the PMOS transistor 11 and the NMOS transistor 12 are made VthnB and VthpB, respectively, if the relationship of $\Delta V \leq VthnB+VthpB$ is satisfied, the short current at the voltage amplification CMOS inverter 1 due to the deteriorated waveform of the sine wave signal is greatly reduced.

Next, the operation of the above configuration will be explained with reference to the timing charts of FIGS. 3A to 3C.

The range of operation of the voltage amplification CMOS inverter 1 is $\Delta V=Vcc-Vthp-Vthn$. In such a state, a sine wave signal is generated by the resonance of the quartz vibrator X1 and the two capacitors C1 and C2.

Figure 3A:
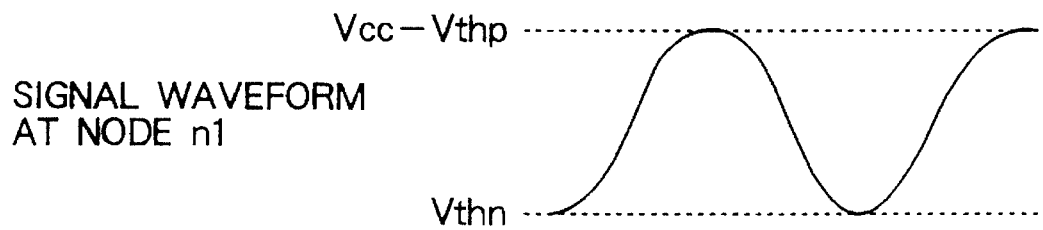
FIGS. 3A to 3C are views of the waveforms at nodes in the circuit of FIG. 2.

At this time, a sine wave signal as shown in FIG. 3A appears. Here, if the level of the sine wave signal input to the voltage amplification CMOS inverter 1 is input at a level (high level) enabling conduction of the NMOS transistor 12, the NMOS transistor 12 becomes on in state and the PMOS transistor 11 becomes off in state. As a result, current flows to the NMOS transistor 41 of the second current mirror circuit 4 and the NMOS transistor 12 of the CMOS inverter 1, and the node n2 is pulled to a voltage (Vthn) shifted by an amount corresponding to the threshold value of the NMOS transistor 41 from the ground level. The waveform signal at the node n2 at this time, as shown in FIG. 3B, while not a complete rectangle, becomes close to a rectangle at the amplitude $\Delta V=Vcc-Vthp-Vthn$.

Note that in this case, since the PMOS transistor 11 of the CMOS inverter 1 becomes off in state, current does not flow to the PMOS transistor 31 of the first current mirror circuit 3 and as a result current does not flow to the PMOS transistor 32 either.

At this time, a current similar to the current flowing to the NMOS transistor 41 flows to the NMOS transistor 42 as well due to the current mirror circuit 4. Due to this, the node n5 shifts to the ground level.

Figure 3B:
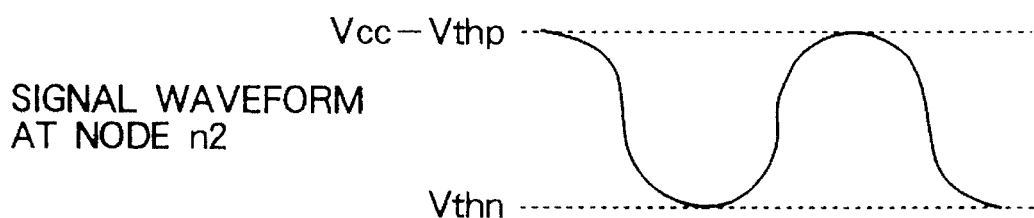
Figure 3C:
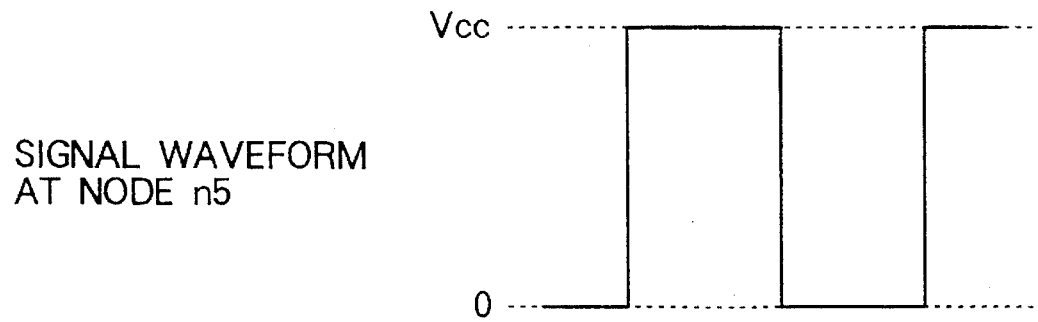

Further, as shown in FIG. 3C, the ground level at the node n5 is inverted at the output CMOS inverter 2, waveform shaped, and output as the rectangular waveform signal OUT.

As opposed to this, if the level of the sine wave signal input to the voltage amplification CMOS inverter 1 is input at the level (low level) enabling conduction of the PMOS transistor 11, the PMOS transistor 11 becomes on in state and the NMOS transistor becomes off in state. As a result, current flows to the PMOS transistor 31 of the first current mirror circuit 3 and the PMOS transistor 11 of the CMOS inverter 1 and the node n2 is charged to Vcc−Vthp.

Even the waveform signal at the node n2 in this case, as shown in FIG. 3B, while not a complete rectangle waveform, becomes close to a rectangle waveform at the amplitude $\Delta V=Vcc-Vthp-Vthn$.

Note that in this case, since the NMOS transistor 12 of the CMOS inverter 1 becomes off in state, no current flows to the NMOS transistor 41 of the second current mirror circuit 4 and as a result a current does not flow to the NMOS transistor 42.

At this time, in the first current mirror circuit 3, a similar current to the current flowing to the PMOS transistor 31 flows in the PMOS transistor 32. Due to this, the node n5 is charged to the power-supply voltage VCC.

Further, as shown in FIG. 3C, the Vcc level at the node n5 is inverted by the output CMOS inverter 2 and output as a waveform-shaped rectangular signal OUT.

As explained above, according to this embodiment, provision is made of the first current mirror circuit 3 at the side of the voltage amplification CMOS inverter 1, to which the quartz vibrator X1 is connected in parallel, which is connected to the power-supply voltage Vcc serving as the first power-supply potential and, when charging and discharging the node n2 of the output end of the CMOS inverter i at a high voltage of Vcc–Vthp and a low voltage of Vthn, the currents flowing to the PMOS transistor 31 and NMOS transistor 41 are transferred to the PMOS transistor 32 and the NMOS transistor 42, and the PMOS transistor 32 and the NMOS transistor 42 to which the currents were transferred are used for charging and discharging the node n5 connected to the input of the output inverter 2 to the power-supply voltage Vcc and the ground level. Therefore, the output node n5 is not directly connected with the output node n2 of the voltage amplification CMOS inverter 1. Accordingly, even if outside noise enters from the input-output terminal T2 to the node n2, there are the advantages that the noise does not appear in the output, generation of unnecessary pulses can be suppressed, and the noise resistance can be enhanced.

Further, it is possible to operate the voltage amplification CMOS inverter 1 in the range of Vthn to Vcc–Vthp, so it is possible to reduce the short current of the inverter caused by the deteriorated input waveform of the sine wave signal and possible to reduce the power consumption.

Figure 4:
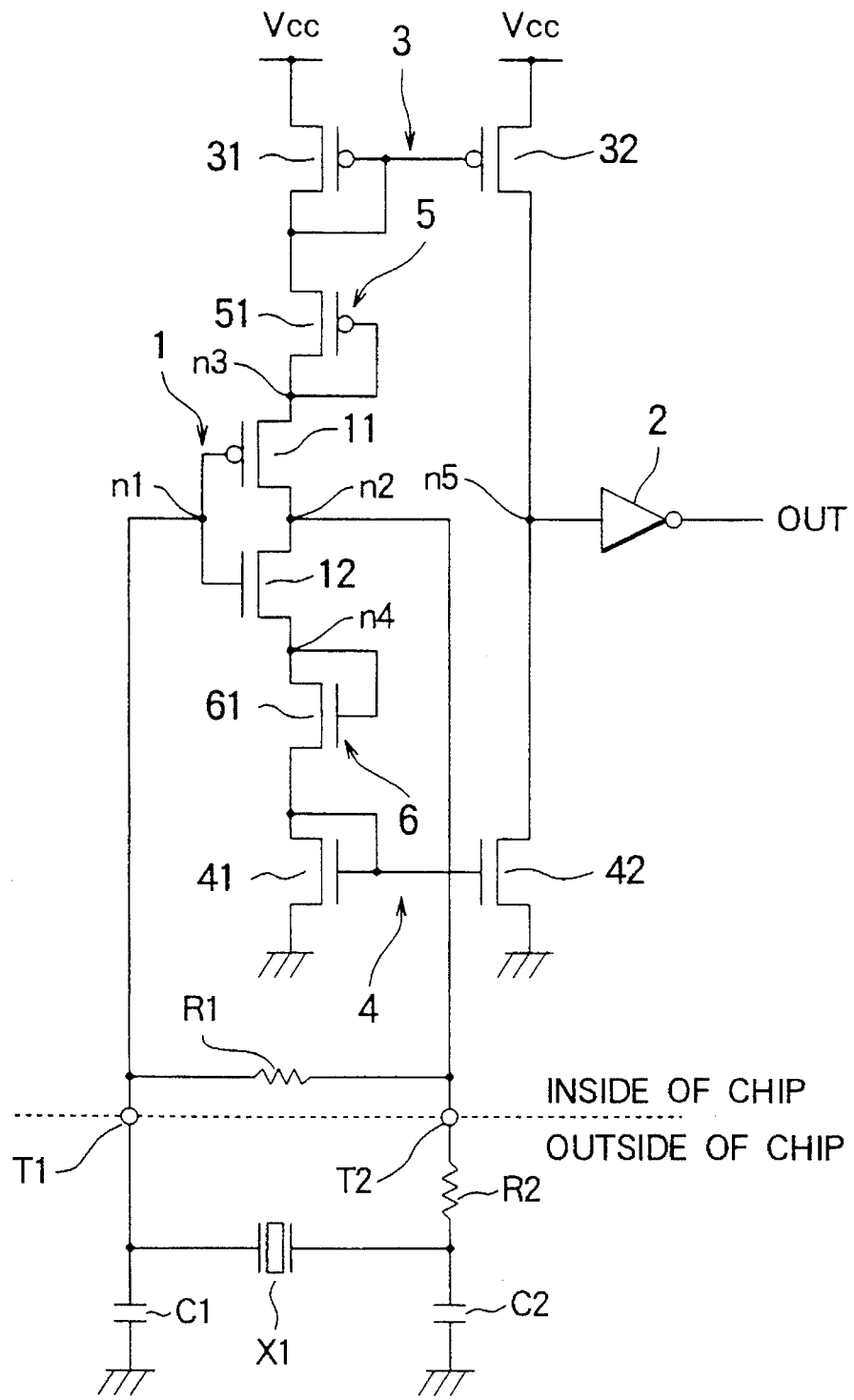
FIG. 4 is a circuit diagram of a crystal oscillator circuit according to a second embodiment of the present invention.

FIG. 4 is a circuit diagram of a crystal oscillator circuit according to a second embodiment of the present invention.

The point of difference of this embodiment from the first embodiment is that provision is made, between the drain of the PMOS transistor 31 of the first current mirror circuit 3 and the source (node n3) of the PMOS transistor 11 of the voltage amplification CMOS inverter 1, of a voltage-dropping (step-down) circuit 5 comprised of a diode-connected PMOS transistor 51 and provision is made, between the drain of the NMOS transistor 41 of the second current mirror circuit 4 and the source (node n4) of the NMOS transistor 12 of the voltage amplification CMOS inverter 1, of a voltage-dropping (step-down) circuit 6 comprised of a diode-connected NMOS transistor 61.

Due to this configuration, it is possible to make the range of operation of the voltage amplification CMOS inverter 1 smaller, possible to suppress the short current of the CMOS inverter 1, and possible to construct an extremely low power consumption oscillator circuit.

This configuration is effective in cases of a high power-supply voltage. By adjusting the stages of connection in accordance with its level, it is possible to effectively suppress the short current.

Note that the constituent elements of the voltage-dropping circuits 5 and 6 are not limited to MOS transistors and for example may also be resistors.

Figure 5:
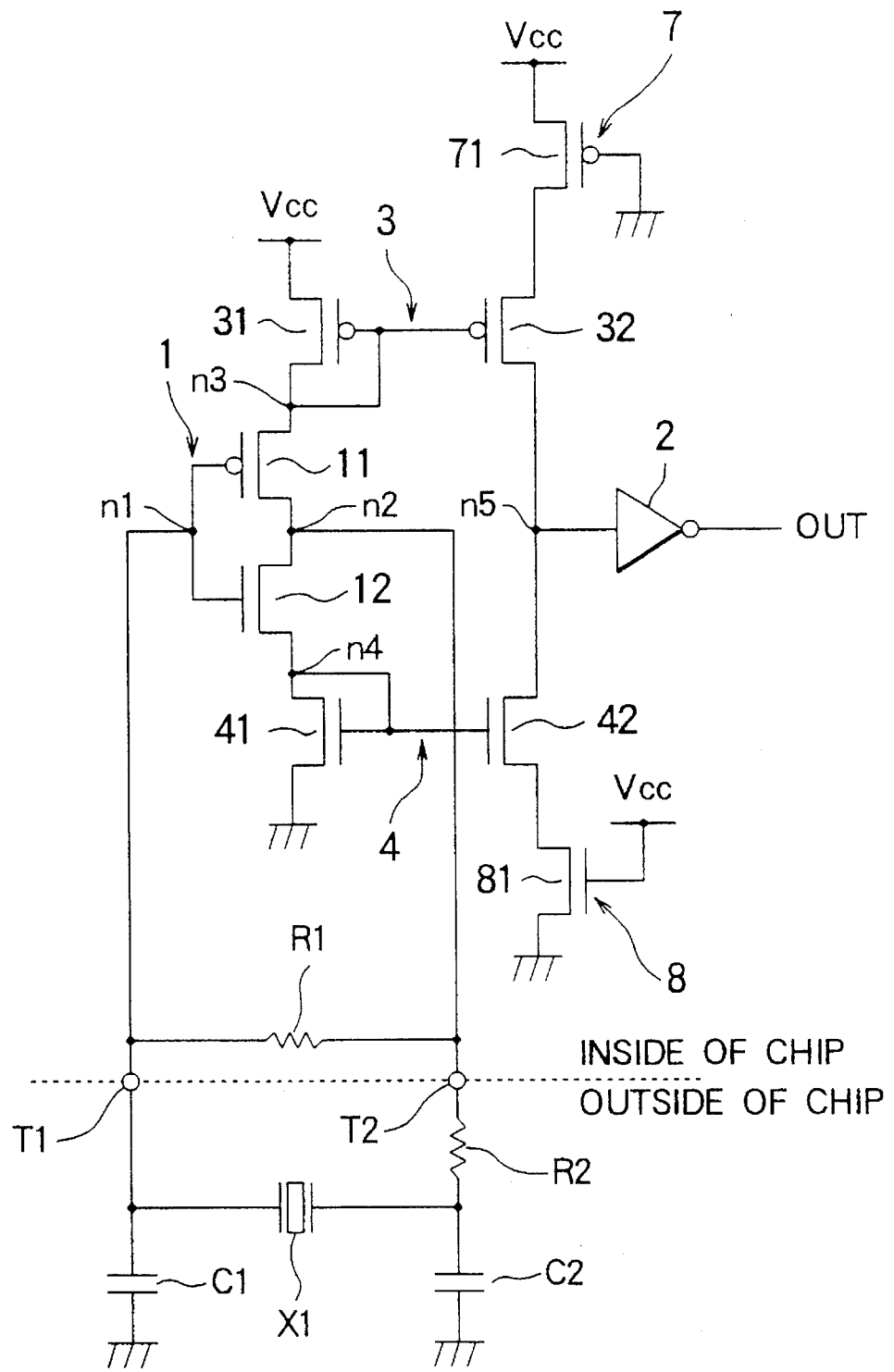
FIG. 5 is a circuit diagram of a crystal oscillator circuit according to a third embodiment of the present invention.

FIG. 5 is a circuit diagram of a crystal oscillator circuit according to a third embodiment of the present invention.

The point of difference of this embodiment from the first embodiment is that to reduce the leakage current of the PMOS transistor 32 and NMOS transistor 42, both connected to the node n5, of the first and second current mirror circuits 3 and 4, provision is made, between the supply line of the power-supply voltage Vcc and the source of the PMOS transistor 32, of a leakage current prevention circuit 7 comprised of a PMOS transistor 71 functioning as a resistor and having a gate connected to the ground line and provision is made, between the ground line and the NMOS transistor 42, of a leakage current prevention circuit 8 comprised of an NMOS transistor 81 functioning as a resistor and having a gate connected to the supply line of the power-supply voltage Vcc.

In this case, since a relatively high resistance is required, the L lengths of the PMOS transistor 71 and NMOS transistor 81 constituting the leakage current prevention circuits 7 and 8 are set to large values.

According to this embodiment, in addition to the effects of the first embodiment explained above, there is the advantage of a reduction of the leakage current and in turn a reduction in the power consumption.

Figure 6:
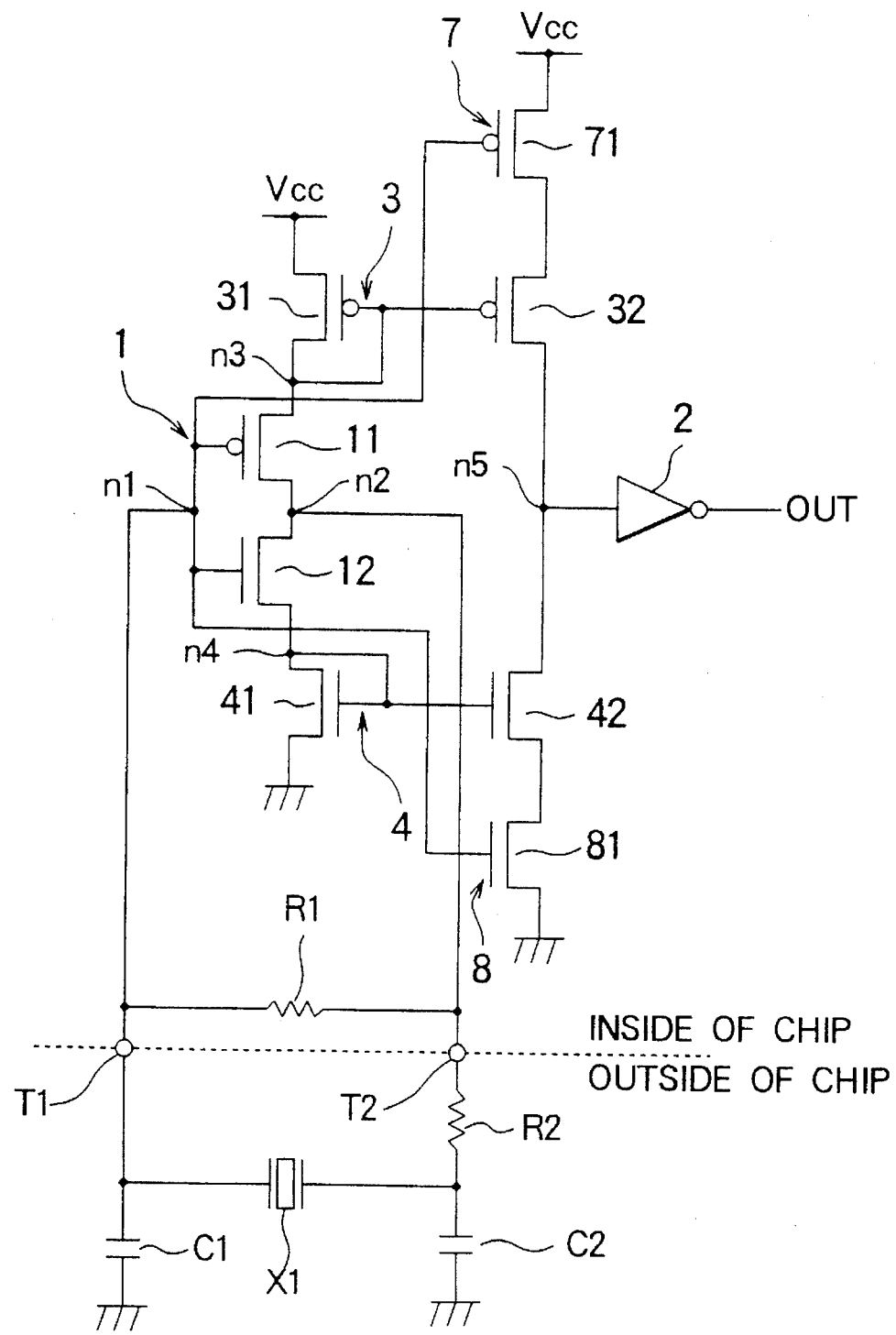
FIG. 6 is a circuit diagram of a crystal oscillator circuit according to a fourth embodiment of the present invention.

FIG. 6 is a circuit diagram of a crystal oscillator circuit according to a fourth embodiment of the present invention.

The point of difference of this embodiment from the first embodiment is that instead of connecting the gates of the PMOS transistor 71 and NMOS transistor 81 of the leakage current prevention circuits 7 and 8 to the ground line and the supply line of the power-supply voltage Vcc, they are connected to the input side node n1 of the voltage amplification CMOS inverter 1, and the PMOS transistor 71 and NMOS transistor 81 of the circuits 7 and 8 are made to function as variable resistors.

In this case, for example, if the node n1 is low in level, current flows to the PMOS transistor 31 of the first current mirror circuit 3, whereby current also flows to the PMOS transistor 32.

At this time, the PMOS transistor 71 of the leakage current prevention circuit 7 becomes on in state, the NMOS transistor 81 of the leakage current prevention circuit 8 becomes off in state, and the node n5 is quickly discharged while suppressing the leakage current.

On the other hand, when the node n1 becomes high in level, current flows to the NMOS transistor 41 of the second current mirror circuit 4, whereby current also flows to the NMOS transistor 42.

At this time, the PMOS transistor 71 of the leakage current prevention circuit 7 becomes off in state, the NMOS transistor 81 of the leakage current prevention circuit 8 becomes on in state, and the node n5 is quickly discharged while suppressing the leakage current.

In this embodiment as well, a similar effect to the effect of the third embodiment explained above can be obtained.

Figure 7:
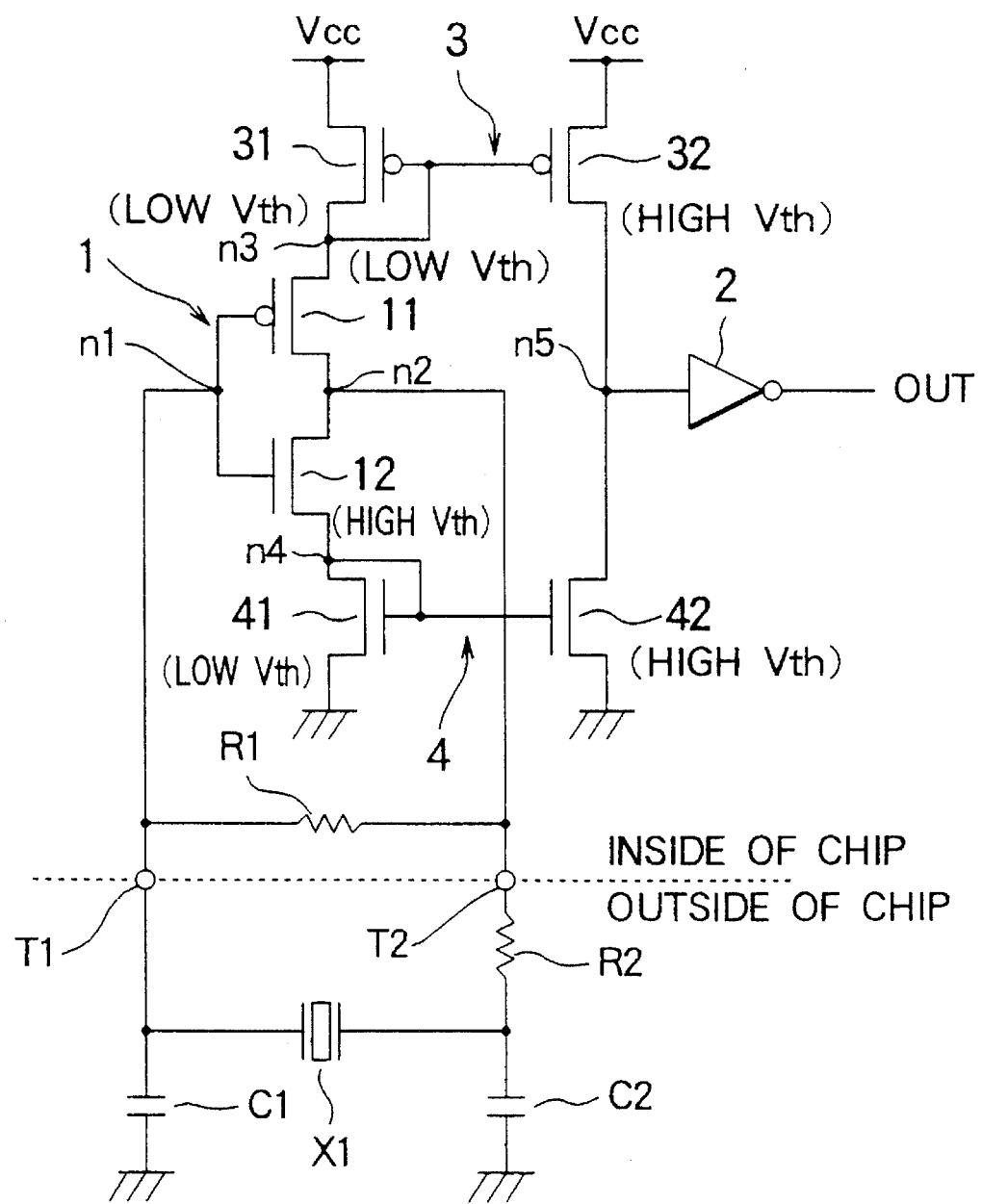
FIG. 7 is a circuit diagram of a crystal oscillator circuit according to a fifth embodiment of the present invention.

FIG. 7 is a circuit diagram of a crystal oscillator circuit according to a fifth embodiment of the present invention.

The point of difference of this embodiment from the first embodiment is that use is made of multiple threshold value type transistors.

In this embodiment, use is made of MOS transistors with low threshold values Vth for the PMOS transistor 31 of the first current mirror circuit 3 and the NMOS transistor 41 of the second current mirror circuit 4. The PMOS transistor 11 and the NMOS transistor 12 of the CMOS inverter 1 and the PMOS transistor 32 of the first current mirror circuit 3 and the NMOS transistor 42 of the second current mirror circuit 4 are made MOS transistors with high threshold values Vth.

According to this embodiment, since transistors with high threshold values Vth are used for the PMOS transistor 11 and the NMOS transistor 12 of the voltage amplification CMOS inverter 1, the effect of suppression of the short current at the CMOS inverter 1 is enhanced.

Further, since use is made of transistors with high threshold values Vth for the PMOS transistors 32 and NMOS transistors 42 of the first and second current mirror circuits 3 and 4, there is the advantage of suppression of the leakage current due to the variations in the L length.

Figure 8:
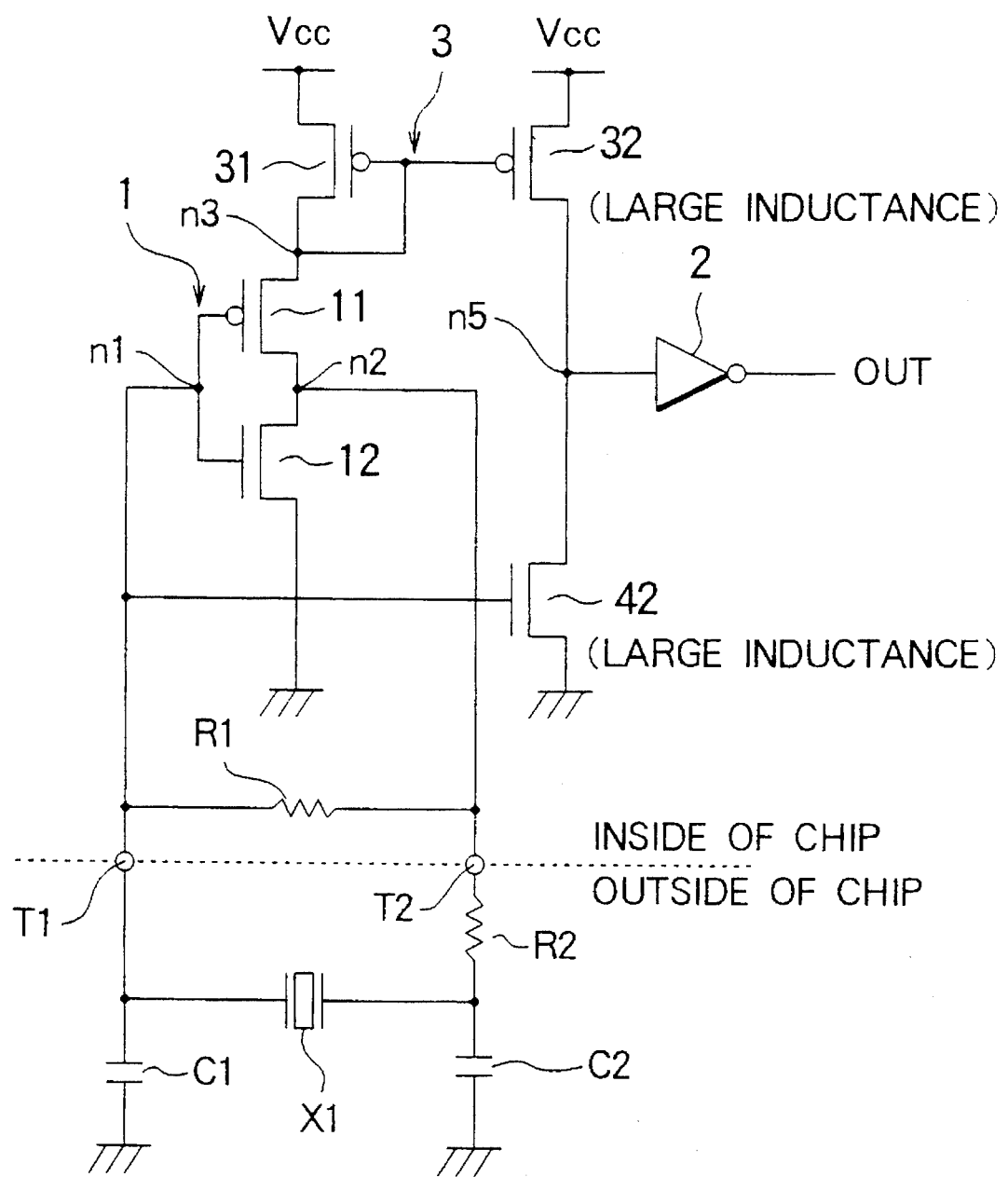
FIG. 8 is a circuit diagram of a crystal oscillator circuit according to a sixth embodiment of the present invention.

FIG. 8 is a circuit diagram of a crystal oscillator circuit according to a sixth embodiment of the present invention.

The point of difference of this embodiment from the first embodiment explained above is that the second current mirror circuit is not provided and the gate of the NMOS transistor 42 connected between the node n5 and the ground is connected to the input side node n1 of the voltage amplification CMOS inverter.

In this case, the source of the NMOS transistor 12 of the voltage amplification CMOS inverter 1 is connected directly to the ground line.

In this case too, when the node n1 becomes high in level, the NMOS transistor 42 turns on and the node n5 is discharged.

This embodiment offers the advantage of a reduction of the number of elements in addition to the effects of the first embodiment explained above.

As explained above, according to the crystal oscillator circuit of the present invention, there is the advantage that the output of the voltage amplification inverter circuit and the output end of the oscillator circuit are separated from each other and not directly connected, so the generation of unnecessary pulses by the external noise entering the output end of the inverter circuit is suppressed and the resistance to noise is improved.

Further, by operating the voltage amplification inverter circuit by a lowered range of voltage, it is possible to reduce the short current of the inverter circuit caused by the deteriorated input waveform of the sine wave signal and possible to reduce the power consumption.

What is claimed is:

1. A crystal oscillator circuit comprising:

a voltage amplification inverter circuit comprising a first PMOS transistor and a first NMOS transistor, each of which comprise a gate, drain and a source terminal, wherein the gate of the first PMOS transistor is connected to the gate of the first NMOS transistor at a first node and the drain of the first PMOS transistor is connected to the drain of the first NMOS transistor at a second node;

a quartz vibrator connected in parallel with the voltage amplification inverter circuit between the first and second nodes;

a first current mirror circuit comprising second and third PMOS transistors with their gates connected together, wherein a current input-output terminal of said first current mirror circuit is connected to the source terminal of said first PMOS transistor at a third node, and wherein the respective sources of the second and third PMOS transistors are connected to a power supply voltage potential; and a second current mirror circuit comprising second and third NMOS transistors with their gates connected together, wherein a current input-output terminal of said second current mirror circuit is connected to the source terminal of said first NMOS transistor at a fourth node, and wherein the respective sources of the second and third NMOS transistors are connected to a ground terminal;

wherein an output node of said crystal oscillator circuit is formed at a connection between the drains of the third PMOS transistor and the third NMOS transistor.

2. A crystal oscillator as set forth in claim 1, further comprising a voltage-dropping circuit coupled between the first current mirror circuit and the inverter circuit for causing the power supply potential to drop by exactly a predetermined potential.

3. A crystal oscillator as set forth in claim 2, wherein said voltage-dropping circuit comprises a diode-connected MOS transistor.

4. A crystal oscillator as set forth in claim 2, wherein said voltage-dropping circuit comprises a resistor.

5. A crystal oscillator as set forth in claim 2, further comprising a second voltage-dropping circuit coupled between the second current mirror circuit and the inverter circuit.

6. A crystal oscillator as set forth in claim 5, wherein said second voltage-dropping circuit comprises a diode-connected MOS transistor.

7. A crystal oscillator as set forth in claim 5, wherein said second voltage-dropping circuit comprises a resistor.

8. A crystal oscillator as set forth in claim 1, wherein the channel length of said third PMOS transistor is made longer than the channel length of said second PMOS transistor, and wherein the channel length of said third NMOS transistor is made longer than the channel length of said second NMOS transistor.

9. A crystal oscillator as set forth in claim 1, further comprising:

a first leakage prevention circuit coupled between the power supply potential and said third PMOS transistor to reduce the leakage current of the third PMOS transistor; and a second leakage prevention circuit coupled between the ground terminal and said third NMOS transistor to reduce the leakage current of the third NMOS transistor.

10. A crystal oscillator as set forth in claim 9, wherein said first and second leakage prevention circuits each comprise a MOS transistor set to a large L length value.

11. A crystal oscillator as set forth in claim 10, wherein the gates of the MOS transistors of the first and second leakage prevention circuits are each connected to said first node and each of the MOS transistors of the first and second leakage prevention circuits function as variable resistors.

12. A crystal oscillator as set forth in claim 10, wherein the gate of the MOS transistor of the first leakage prevention circuit is connected to the ground terminal and the gate of the MOS transistor of the second leakage prevention circuit is connected to the power supply terminal.

13. A crystal oscillator as set forth in claim 1, further comprising:

a first capacitor having a first end connected to ground and a second end connected to a first end of said quartz vibrator;

a second capacitor having a first end connected to ground and a second end connected to a second end of said quartz vibrator;

a stabilizing resistor connected between said second node and said second end of said second capacitor; and a second resistor connected between said first and second nodes.

* * * * *